United States Patent
Sills et al.

(10) Patent No.: US 11,730,069 B2
(45) Date of Patent: Aug. 15, 2023

(54) MEMORY CELL STRUCTURES

(71) Applicant: Micron Technology, Inc., Boise, ID (US)

(72) Inventors: Scott E. Sills, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 16/926,837

(22) Filed: Jul. 13, 2020

(65) Prior Publication Data
US 2020/0343449 A1    Oct. 29, 2020

Related U.S. Application Data

(60) Division of application No. 15/423,965, filed on Feb. 3, 2017, now Pat. No. 10,734,581, which is a continuation of application No. 13/899,919, filed on May 22, 2013, now Pat. No. 9,691,981.

(51) Int. Cl.
*H10N 70/00* (2023.01)
*H10B 63/00* (2023.01)

(52) U.S. Cl.
CPC ........... *H10N 70/066* (2023.02); *H10B 63/20* (2023.02); *H10B 63/22* (2023.02); *H10B 63/82* (2023.02); *H10B 63/84* (2023.02)

(58) Field of Classification Search
CPC .................. H01L 27/2481; H01L 45/1683
See application file for complete search history.

(56) References Cited

U.S. PATENT DOCUMENTS

| | | | |
|---|---|---|---|
| 5,497,017 A | 3/1996 | Gonzales | |
| 5,793,112 A | 8/1998 | Hasegawa et al. | |
| 6,709,874 B2 | 3/2004 | Ning | |
| 6,887,792 B2 | 5/2005 | Perlov et al. | |
| 7,361,586 B2 | 4/2008 | Adem et al. | |
| 7,365,382 B2 | 4/2008 | Willer et al. | |
| 7,371,604 B2 | 5/2008 | Lee et al. | |

(Continued)

FOREIGN PATENT DOCUMENTS

| | | |
|---|---|---|
| CN | 1783455 A | 6/2006 |
| CN | 102318058 A | 1/2012 |

(Continued)

OTHER PUBLICATIONS

Kau, et al., "A Stackable Cross Point Phase Change Memory," IEEE Xplore, Dec. 2009, pp. 27.1.1-27.1.4.

(Continued)

*Primary Examiner* — Raj R Gupta
(74) *Attorney, Agent, or Firm* — Brooks, Cameron & Huebsch, PLLC

(57) ABSTRACT

The present disclosure includes memory cell structures and method of forming the same. One such method includes forming a memory cell includes forming, in a first direction, a select device stack including a select device formed between a first electrode and a second electrode; forming, in a second direction, a plurality of sacrificial material lines over the select device stack to form a via; forming a programmable material stack within the via; and removing the plurality of sacrificial material lines and etching through a portion of the select device stack to isolate the select device.

16 Claims, 4 Drawing Sheets

(56) References Cited

U.S. PATENT DOCUMENTS

| | | | |
|---|---|---|---|
| 7,435,648 B2 | 10/2008 | Hsu et al. | |
| 7,449,354 B2 | 11/2008 | Merchant et al. | |
| 7,888,711 B2 | 2/2011 | Cheung et al. | |
| 7,927,977 B2 | 4/2011 | Makala et al. | |
| 8,227,786 B2 | 7/2012 | Mikawa et al. | |
| 8,338,224 B2 | 12/2012 | Yoon et al. | |
| 8,409,915 B2 | 4/2013 | Smythe et al. | |
| 8,416,609 B2 | 4/2013 | Meade | |
| 8,437,174 B2 | 5/2013 | Meade et al. | |
| 8,507,889 B2 | 8/2013 | Nagashima | |
| 8,519,371 B2 | 8/2013 | Fukumizu et al. | |
| 8,871,561 B2 | 10/2014 | Takahashi et al. | |
| 9,691,981 B2 | 6/2017 | Sills et al. | |
| 2008/0242028 A1* | 10/2008 | Mokhlesi | H01L 27/115 257/E27.012 |
| 2009/0020739 A1 | 1/2009 | Arnold et al. | |
| 2009/0034323 A1* | 2/2009 | Lung | H01L 45/1625 365/163 |
| 2009/0250681 A1 | 10/2009 | Smythe et al. | |
| 2009/0272960 A1 | 11/2009 | Srinivasan et al. | |
| 2009/0317540 A1 | 12/2009 | Sandhu et al. | |
| 2010/0019221 A1 | 1/2010 | Lung et al. | |
| 2010/0078759 A1 | 4/2010 | Sekar et al. | |
| 2010/0127358 A1 | 5/2010 | Tanaka | |
| 2010/0155687 A1* | 6/2010 | Reyes | H01L 45/04 257/4 |
| 2010/0207168 A1 | 8/2010 | Sills et al. | |
| 2010/0237320 A1* | 9/2010 | Nagashima | H01L 27/2409 257/E21.602 |
| 2010/0264393 A1 | 10/2010 | Mikawa et al. | |
| 2010/0301330 A1 | 12/2010 | Ho et al. | |
| 2011/0199812 A1 | 8/2011 | Kitagawa et al. | |
| 2011/0210306 A1 | 9/2011 | Li et al. | |
| 2012/0147644 A1 | 6/2012 | Scheuerlein | |
| 2013/0092894 A1 | 4/2013 | Sills et al. | |
| 2014/0346428 A1 | 11/2014 | Sills et al. | |

FOREIGN PATENT DOCUMENTS

| | | |
|---|---|---|
| JP | 2009218259 A | 9/2009 |
| JP | 2010027753 A | 2/2010 |
| JP | 2010225741 A | 10/2010 |
| JP | 2012533885 A | 12/2012 |
| KR | 10-2010-0083402 A | 7/2010 |
| KR | 10-2010-0112641 A | 10/2010 |
| KR | 10-2011-0118676 A | 10/2011 |
| WO | 2007116749 A1 | 10/2007 |
| WO | 2012105225 A1 | 8/2012 |
| WO | 2013058917 A1 | 4/2013 |

OTHER PUBLICATIONS

International Search Report and Written Opinion from related international application No. PCT/US2014/037299, dated Sep. 17, 2014, 13 pp.

Office Action from related Taiwan patent application No. 103117213, dated Jun. 14, 2016, 11 pp.

Office Action from related Japanese patent application No. 2015-559324, dated Aug. 9, 2016, 8 pp.

Meyer, et al., "Oxide Dual-Layer Memory Element for Scalable Non-Volatile Cross-Point Memory Technology," IEEE Technology, Nov. 2008, (5 pgs.).

Extended Search Report from related European application No. 14800773.5 dated Dec. 14, 2016, 6 pp.

Third Office Action from related Chinese patent application No. 201480017654.3, dated Jun. 26, 2018, 15 pages.

Second Office Action from related Chinese patent application No. 201480017654.3, dated Jan. 2, 2018, 16 pages.

Rejection Decision from related Chinese patent application No. 201480017654.3, dated Nov. 21, 2018, 14 pages.

Notice of Preliminary Rejection from related Korean patent application No. 10-2015-7035797, dated Jan. 31, 2017, 16 pages.

* cited by examiner

MEMORY CELL STRUCTURES

PRIORITY INFORMATION

This application is a Divisional of U.S. application Ser. No. 15/423,965, filed Feb. 3, 2017, which is a Continuation of U.S. application Ser. No. 13/899,919 filed May 22, 2013, which issued as U.S. Pat. No. 9,691,981 on May 22, 2013, the specification of which is incorporated herein by reference.

TECHNICAL FIELD

The present disclosure relates generally to semiconductor memory devices and methods, and more particularly, memory cell structures and methods for forming the same.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), spin torque transfer random access memory (STTRAM), resistive random access memory (RRAM), magnetoresistive random access memory (MRAM; also referred to as magnetic random access memory), conductive-bridging random access memory (CBRAM), among others.

Some types of memory devices can be non-volatile memory and can be used for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a smartphone, a tablet, a portable music player, e.g., MP3 player, a movie player, and other electronic devices, among others. Program code and system data, such as a basic input/output system (BIOS), are typically stored in non-volatile memory devices.

Many memory devices, such as RRAM, PCRAM, MRAM, STTRAM and CBRAM, for example, can include arrays of memory cells organized in a two-terminal cross-point architecture, for instance. Arrays of memory cells in a two-terminal cross-point architecture can include electrodes that have planar surfaces between the memory cell material. For filamentary-type memory device, e.g., RRAM and/or CBRAM, the location of the active region of the memory cell between planar surfaces of the electrodes can be variable because the planar surfaces of the electrodes provide a substantially uniform electric field across the memory cell material.

DETAILED DESCRIPTION

Figure 1:
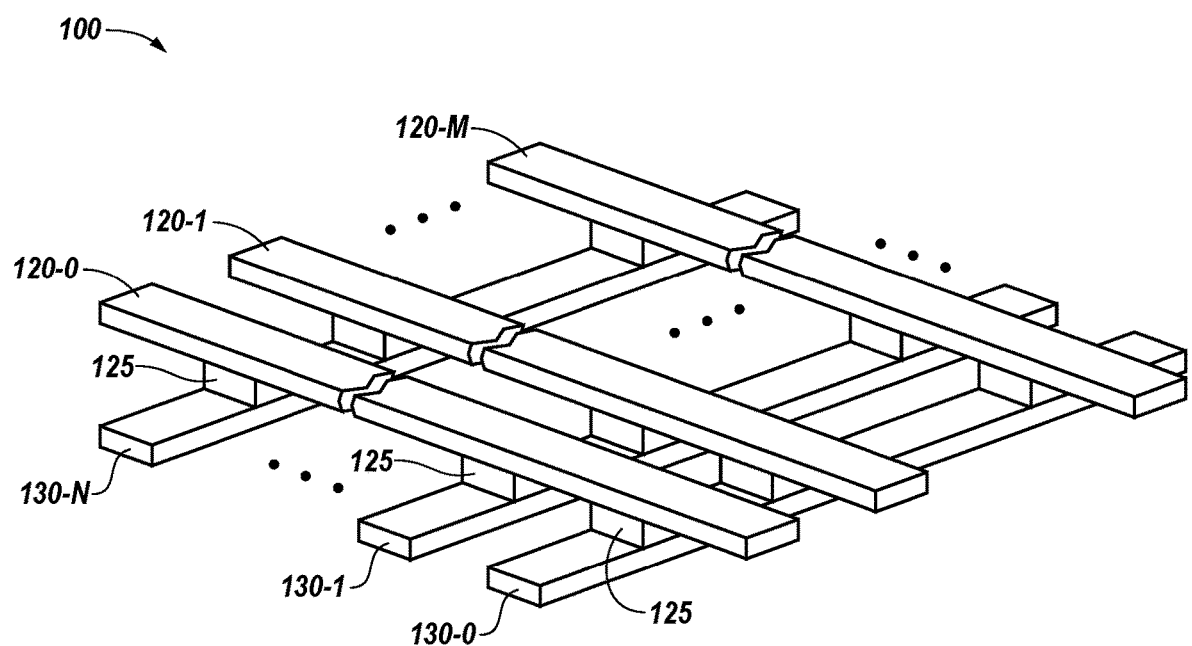
FIG. 1 is a block diagram illustrating a portion of an array of memory cells.

The present disclosure includes memory cell structures and method of forming the same. In one or more embodiments, forming a memory cell includes forming, in a first direction, a select device stack including a select device formed between a first electrode and a second electrode; forming, in a second direction, a plurality of sacrificial material lines over the select device stack to form a via; forming a programmable material stack within the via; and removing the plurality of sacrificial material lines and etching through a portion of the select device stack to isolate the select device.

In one or more embodiments, a memory cell includes a first stack structure comprising a first electrode, a select device over the first electrode, and a second electrode; and a second stack structure comprising a programmable material over the second electrode and a third electrode over the programmable material, wherein the second stack structure is a damascene structure.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 208 may reference element "08" in FIG. 2, and a similar element may be referenced as 308 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a block diagram illustrating a portion of an array 100 of memory cells. In the example illustrated in FIG. 1, the array 100 is a cross-point array including a first number of conductive lines 130-0, 130-1, . . . , 130-N, e.g., access lines, which may be referred to herein as word lines, and a second number of conductive lines 120-0, 120-1, . . . , 120-M, e.g., digit lines, which may be referred to herein as bit lines. As illustrated, the word lines 130-0, 130-1, . . . , 130-N are substantially parallel to each other and are substantially orthogonal to the bit lines 120-0, 120-1, . . . , 120-M, which are substantially parallel to each other; however, embodiments are not so limited.

The memory cells of array 100 can be memory cells such as those described in connection with FIGS. 2A-2D and FIGS. 3A-3B. In this example, a memory cell is located at each of the intersections of the word lines 130-0, 130-1, . . . , 130-N and bit lines 120-0, 120-1, . . . , 120-M and the memory cells can function in a two-terminal architecture, e.g., with a particular word line 130-0, 130-1, . . . , 130-N and bit line 120-0, 120-1, . . . , 120-M as the electrodes for the memory cells.

The memory cells can be, for example, resistance variable memory cells, e.g., RRAM cells, CBRAM cells, PCRAM cells, and/or STT-RAM cells, among other types of memory cells. A storage element 125 can include a storage element material and/or a select device, e.g., an access device. The storage element material portion of storage element 125 can include a programmable portion of the memory cell, e.g., the portion programmable to different data states. The select device can be a diode or a non-ohmic device (NOD), among others. For instance, in resistance variable memory cells, a storage element can include the portion of the memory cell having a resistance that is programmable to particular levels corresponding to particular data states responsive to applied programming voltage and/or current pulses, for instance. A storage element can include one or more materials, which collectively comprise a variable resistance storage element material portion of a storage element. For instance, the materials may include at least one of a metal ion source layer, an oxygen gettering, e.g., source, layer, and an active switching layer, such as a solid state electrolyte, a chalcogenide, a transition metal oxide material, or a mixed valence oxide with two or more metals, e.g., transition metals, alkaline earth metals, and/or rare earth metals. Embodiments are not limited to a particular resistance variable material or materials associated with the storage elements 125 of the memory cells. For instance, the resistance variable material can be a chalcogenide formed of various doped or undoped materials. Other examples of resistance variable materials that can be used to form storage elements include binary metal oxide materials, colossal magnetoresistive materials, and/or various polymer based resistance variable materials, among others.

In operation, the memory cells of array 100 can be programmed by applying a voltage, e.g., a write voltage, across the memory cells via selected word lines 130-0, 130-1, . . . , 130-N and bit lines 120-0, 120-1, . . . , 120-M. The width and/or magnitude of the voltage pulses across the memory cells can be adjusted, e.g., varied, in order to program the memory cells to particular data states, e.g., by adjusting a resistance level of the storage element.

A sensing, e.g., read, operation can be used to determine the data state of a memory cell by sensing current, for example, on a bit line 120-0, 120-1, . . . , 120-M corresponding to the respective memory cell responsive to a particular voltage applied to the selected word line 130-0, 130-1, . . . , 130-N to which the respective cell is coupled. Sensing operations can also include biasing unselected word lines and bit lines at particular voltages in order to sense the data state of a selected cell.

Memory cells and arrays in accordance with the present disclosure can be configured in a cross-point memory array architecture, e.g., a three-dimensional (3D) cross-point memory array architecture. Memory cells and arrays in accordance with the present disclosure can include materials not compatible with certain etching processes, e.g., plasma dry-etching processes. For example, by utilizing a damascene process, a memory cell can be formed within a cross-point memory array architecture without having to etch the memory cell, which can cause damage to the memory cell.

FIGS. 2A-2D illustrate a portion of an array of memory cells in accordance with one or more embodiments of the present disclosure. The portion of the array of memory cells in FIGS. 2A-2D can be a portion of an array such as array 100 illustrated in FIG. 1.

Figure 2A:
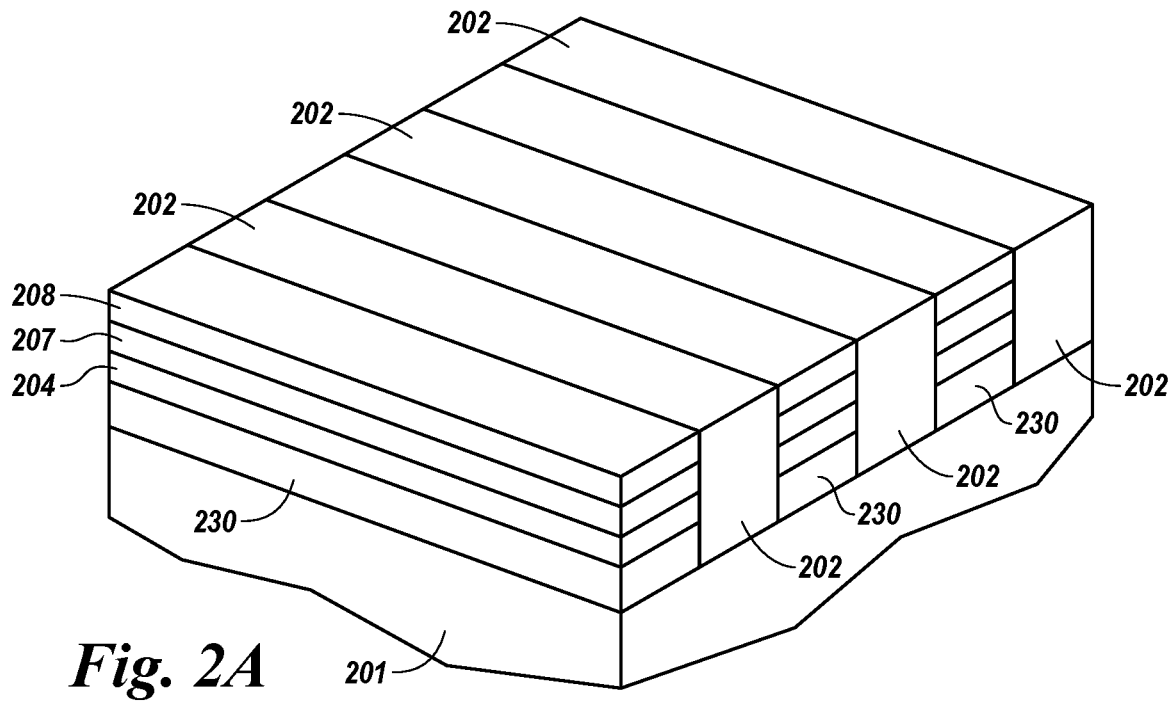
FIGS. 2A-2D illustrate a portion of an array of memory cells in accordance with one or more embodiments of the present disclosure.

FIG. 2A illustrates a portion of an array of memory cells in accordance with one or more embodiments of the present disclosure. As illustrated in FIG. 2A, a substrate material 201 can be formed. The substrate material 201 can be a semiconductor material, for example silicon, among other substrate materials. A word line material 230 can be formed over substrate material 202, and an electrode material 204 can be formed over word line material 230, for instance. Word line material can be a conductive material, such as tungsten, among other conductive materials. The electrode material 204 can be a conductive material, such as carbon and/or tungsten, among other conductive materials. The electrode material 204 can be a bottom electrode, e.g., a conductive line, for example, an access line such as word lines 130-0 to 130-N or a data line such as bit lines 120-0 to 120-M shown in FIG. 1. Electrode material 204 can be formed in a first direction.

In one or more embodiments, a select device 207, is formed over electrode material 204. Select device 207 can be, for example, a non-ohmic, non-linear select device, and select device 207 can be symmetric or asymmetric. Select device 207 can be formed in a same direction as electrode material 204, e.g., an access line direction.

In one or more embodiments electrode material 208 can be formed over select device 207 to form a stack structure. The electrode material 208 can be a conductive material, such as carbon and/or tungsten, for example. The electrode material 208 can be a bottom electrode, e.g., a conductive line, for example, an access line such as word lines 130-0 to 130-N or a data line such as bit lines 120-0 to 120-M shown in FIG. 1. Electrode material 208 can be formed in a same direction as electrode material 204 and select device 207, e.g., an access line direction.

The stack structure comprising electrode material 204, select device 207, and electrode material 208 can include a metal-semiconductor-metal (MSM), metal-insulator-metal (MIM), and/or conductor-semiconductor-conductor (CSC) configurations, among others. For example, electrode material 204 can be a metal material, select device 207 can be a semiconductor material, and electrode material 208 can be a metal. In some embodiments, select device 207 may comprise a stack structure of multiple semiconductor and or insulator materials, such that the entire stack has a configuration of one of metal-insulator-insulator-metal (MIIM), metal-semiconductor-semiconductor-metal (MSSM), metal-insulator-semiconductor-metal (MISM), metal-semiconductor-insulator-metal (MSIM), metal-insulator-semiconductor-insulator-metal (MISIM), metal-semiconductor-insulator-semiconductor-metal (MSISM), metal-insulator-insulator-insulator-metal (MIIIM), and metal-semiconductor-semiconductor-semiconductor-metal (MSSSM). This stack structure can be a select device stack structure formed in a first direction, e.g., an access line direction, in a number of embodiments.

In a number of embodiments, the stack structure can be masked and a number of portions of the stack structure can be etched to the substrate 201 to isolate portions of the stack structure in the access line direction. A dielectric material 202 can be formed in openings between the isolated portions of the stack structure in a same direction, e.g., an access line direction, as electrode material 204, select device 207, and electrode material 208. The dielectric material 202 can be a dielectric oxide or nitride, such as silicon nitride ($Si_3N_4$) or silicon oxide (SiOx), among other dielectric materials.

In a number of embodiments the dielectric material 202 and the electrode material 208 can be planarized forming a planar surface of the dielectric material 202 and the electrode material 208. Dielectric material 202 can be isolated via filling and polishing of the dielectric material 202, for example.

Figure 2B:
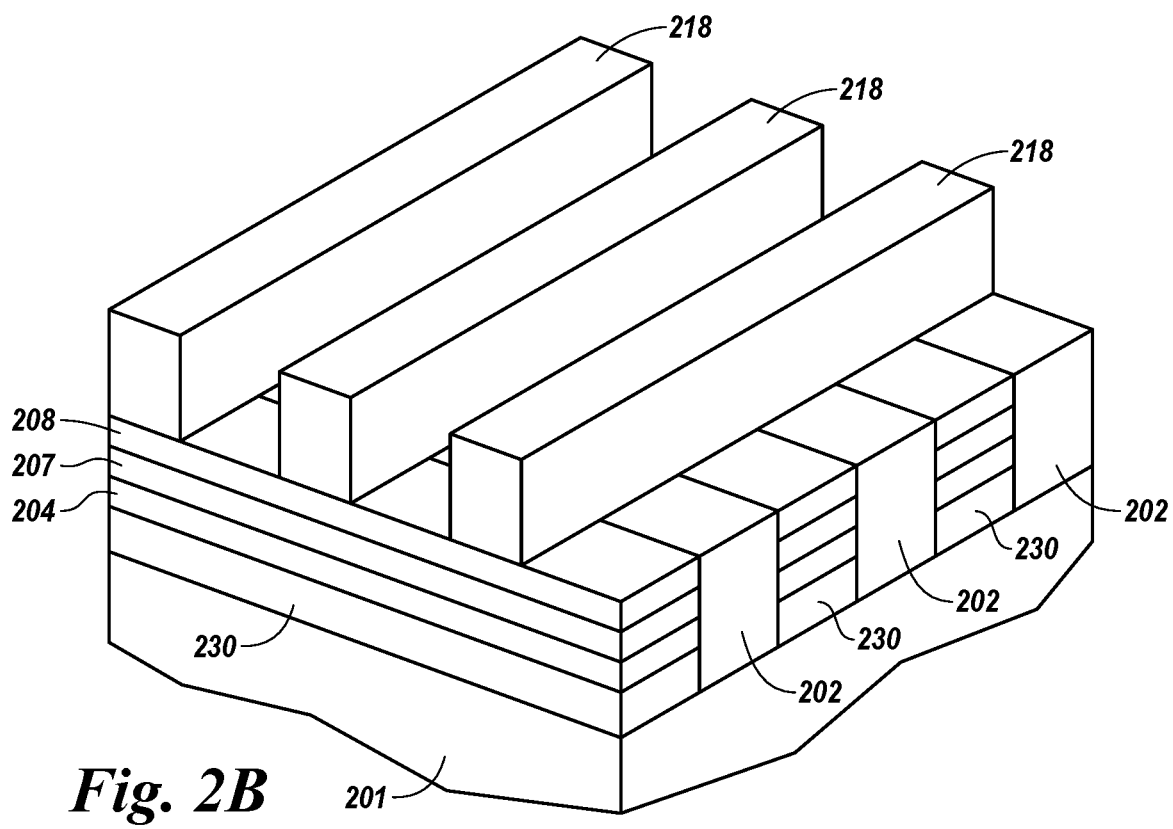

FIG. 2B illustrates a portion of an array of memory cells shown in a stage subsequent to that shown in FIG. 2A. In one or more embodiments, sacrificial material 218, e.g., sacrificial lines or sacrificial material lines, can be formed over electrode material 208 and/or dielectric material 202 in a second direction. Sacrificial material 218 can be formed to create vias, e.g., trenches, to house programmable material, e.g., cell material.

Sacrificial material 218 can comprise sacrificial material that can be removed selective to a programmable material in the created vias. For example, sacrificial material 218 can comprise carbon, among other materials.

Sacrificial material 218 can be formed in a direction substantially orthogonal to the direction in which electrode materials 204 and 208 and select device 207 are formed. Substantially orthogonal can comprise, for example, a little more than orthogonal or a little less orthogonal, but within a threshold. For example, a substantially orthogonal direction can comprise a direction that is closer to orthogonal than parallel. For example, sacrificial material 218 may be formed in a direction that is not orthogonal, but is closer to orthogonal than parallel.

Although illustrated in FIG. 2B as being formed in a direction substantially orthogonal to the direction in which electrode materials 204 and 208 and select device 207 are formed, sacrificial material 218 can be formed in a non-orthogonal direction in a number of embodiments. For example, a sacrificial material can be formed at an angle of substantially 60 degrees (e.g., a little more than 60 degrees or a little less than 60 degrees, but within a threshold) with respect to the direction in which electrode materials and select device are formed, resulting, for example, in a cross-point array having a hexagonal closed packed pattern, which may have an increased density over a cubic pattern.

Figure 2C:
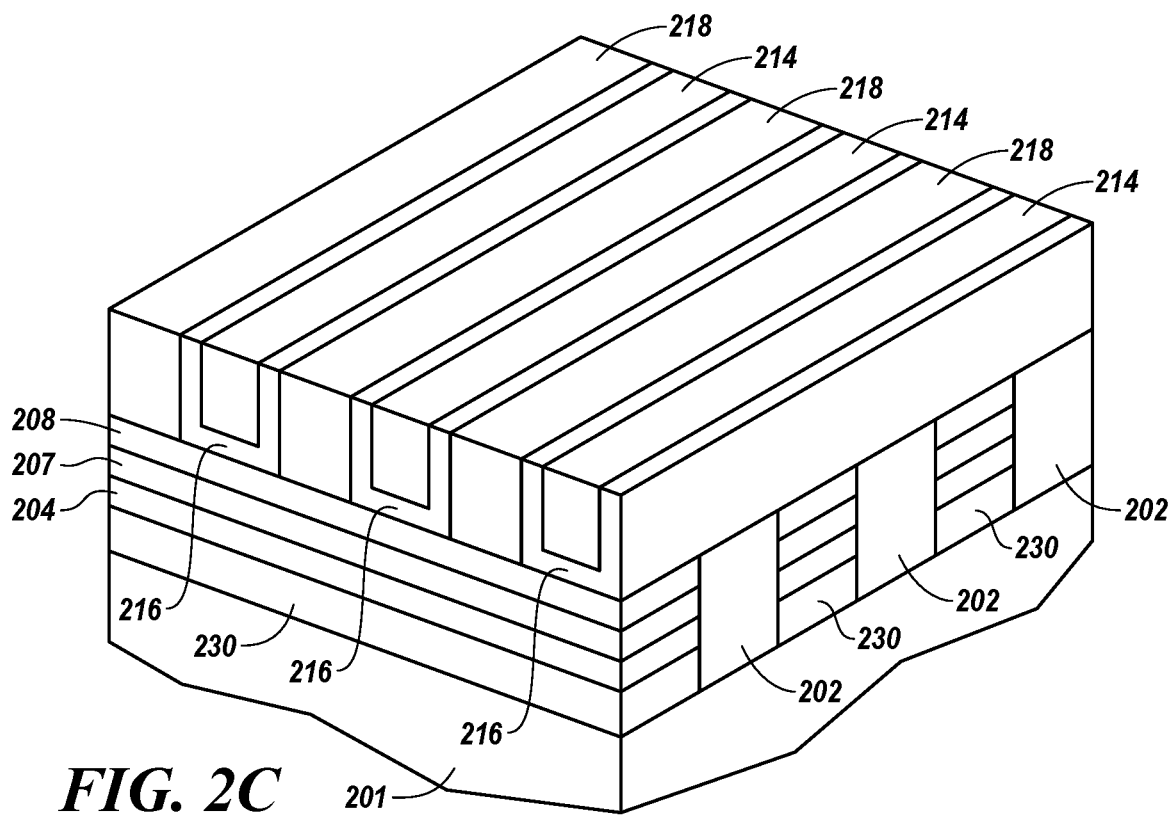

FIG. 2C illustrates a portion of an array of memory cells shown in a stage subsequent to that shown in FIG. 2B. In one or more embodiments, a programmable material 216 can be formed within vias, e.g., vias formed by the formation of sacrificial material 218 as illustrated in FIG. 2B. Programmable material 216 can comprise, for example, PCRAM, STTRAM, RRAM, MRAM, PCM, CBRAM, and oxygen vacancy-based materials, among others. For example, programmable material 216 can include one or more resistance variable materials such as a transition metal oxide material or a perovskite including two or more metals, e.g., transition metals, alkaline earth metals, and/or rare earth metals. The programmable material 216 can include, for instance, one or more resistance variable materials such as a solid state electrolyte comprised of a transition metal oxide material or a chalcogenide material. Embodiments are not limited to a particular resistance variable material. In one or more embodiments, programmable material 216 can comprise material that forms a storage element material.

Electrode material 214 can be formed over programmable material 216 within the vias formed during the formation of sacrificial material 218. For instance, electrode material 214 and programmable material 216 can form a stack or a portion of a stack, e.g., a programmable material stack. Electrode material 214 can be a top electrode. In one or more embodiments, electrode material 214 can comprise copper material, among other materials. Programmable material 216 and electrode material 214 can comprise a stack structure, and the stack structure can be polished utilizing chemical-mechanical planarization (CMP), for example.

In one or more embodiments, the stack structure of programmable material 216 and electrode material 214 can comprise a damascene structure. For example, programmable material 216 and electrode material 214 can be formed in a non-etch-based manner, e.g., a non-etch damascene deposition manner.

Figure 2D:
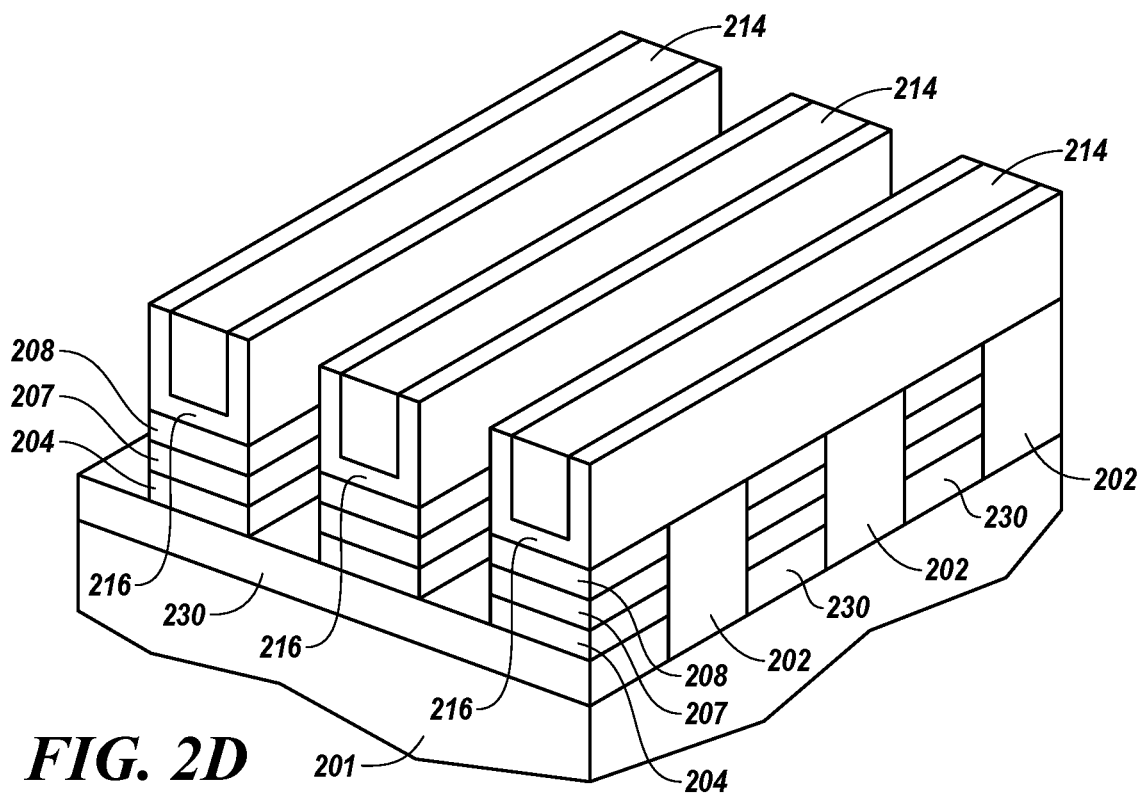

FIG. 2D illustrates a portion of an array of memory cells shown in a stage subsequent to that shown in FIG. 2C. In one or more embodiments, sacrificial material 218 can be removed, e.g., exhumed or burned out. For example, the sacrificial material 218 can be exhumed using an oxygen plasma material. Sacrificial material 218 can be exhumed, in one or more embodiments, without impacting and/or damaging the stack structure of programmable material 216 and electrode material 214 and the stack structure of electrode material 204, select device 207, and electrode material 208.

In one or more embodiments, the select device stack including electrode material 204, electrode material 208, and select device 207 can be etched to isolate select device 207. The etching can comprise etching through electrode material 208; etching through electrode material 208 and select device 207; or etching through electrode material 208, select device 207, and electrode material 204. In one or more examples, a portion of any of the electrode material 208, select device 207, and electrode material 208 can be etched.

The select device stack can be etched utilizing an isotropic etching process, such as plasma dry etching and/or a wet etch process, for example. The etching process can be a selective etch process that etches down to word line material 230 or substrate material 201, for example.

Memory cells in accordance with the embodiments illustrated in FIGS. 2A-2D can provide for the formation of memory cell arrays in a cross-point architecture utilizing memory cell materials that cannot be etched. For example, certain materials may not be compatible with an etching process, e.g., plasma dry-etching processes, and/or may be damaged during an etching process, e.g., halogen materials.

In one or more embodiments, the memory cell arrays illustrated in FIGS. 2A-2D can be configured in a three-dimensional (3D) cross-point memory cell array. In one or more embodiments, the processes of forming a memory cell and/or memory cell array can be repeated a number of times to create a number of tiers. For example, the process of forming the stack structure of electrode material 204, select device 207, and electrode material 208; forming dielectric material 202; forming sacrificial material 218; forming the stack structure of programmable material 216 and electrode material 214; exhuming sacrificial material 218; and etching at least a portion of the stack structure of electrode material 204, select device 207, and electrode material 208 can be repeated a number of times to form a number of memory cell and/or memory cell tiers.

In one or more embodiments, forming an additional tier in a 3D cross-point memory cell array can comprise the following: forming a substrate material over a programmable material 216 and electrode material 214; forming a word line over the substrate material; forming a first electrode material over the word line; forming a select device over the first electrode material; forming a second electrode material over the select device; forming sacrificial material over the second electrode material, e.g., in a direction substantially orthogonal to the second electrode material;

forming a programmable material and a third electrode material in a via formed by the sacrificial material; exhuming the sacrificial material; and etching at least a portion of the first electrode, select device, and second electrode.

In one or more embodiments, forming an additional tier in a 3D cross-point memory cell array may not comprise forming a substrate material over programmable material 216 and electrode material 214 and/or forming a word line, e.g., a word line 230 as illustrated in FIGS. 2A-2D, for instance.

Figure 3A:
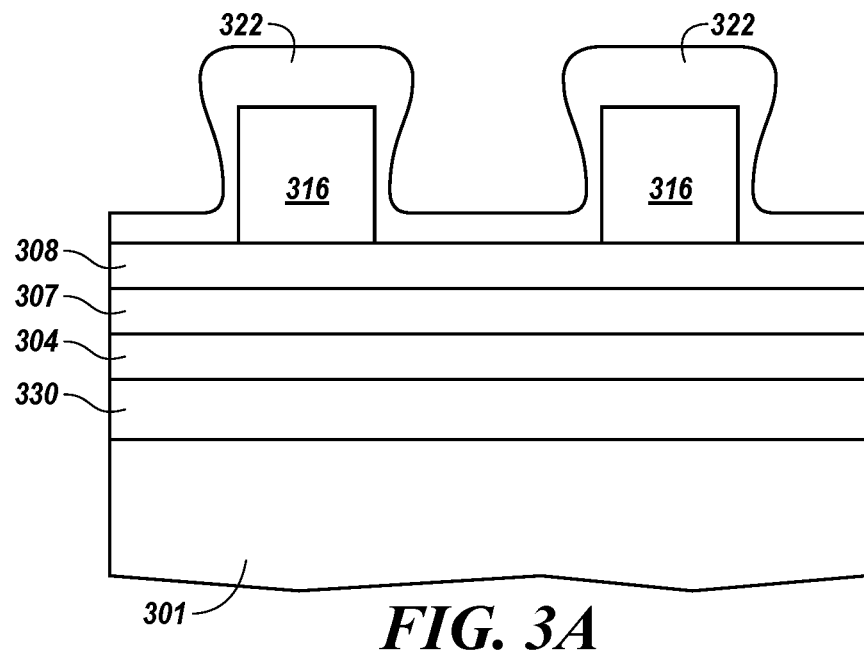
FIGS. 3A-3B illustrate of a cross-section of a portion of an array of memory cells in accordance with one or more embodiments of the present disclosure.
Figure 3B:
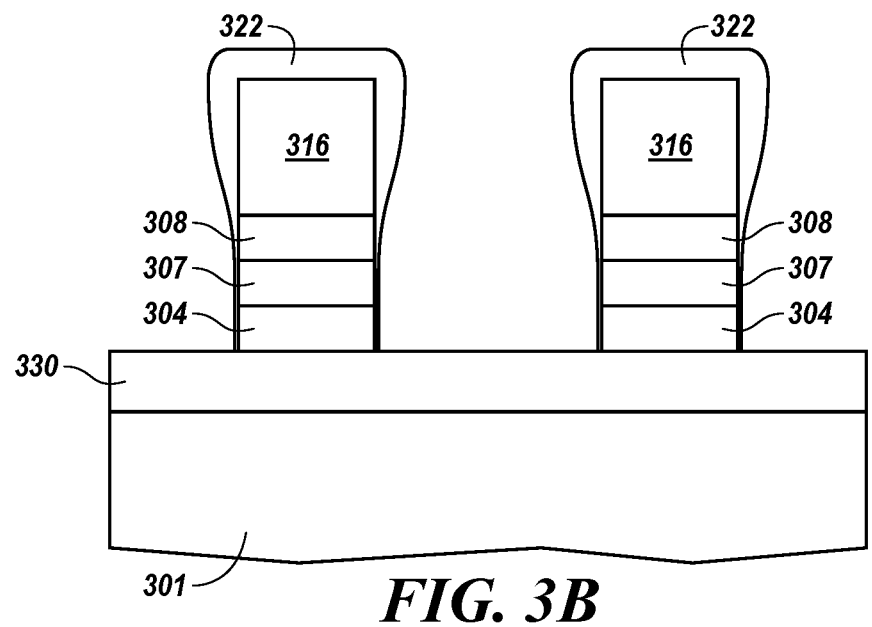

FIGS. 3A-3B illustrate a cross section of a portion of an array of memory cells in accordance with one or more embodiments of the present disclosure. The portion of the array of memory cells in FIGS. 3A-3B can be a portion of an array such as array 100 illustrated in FIG. 1.

FIG. 3A illustrates a portion of an array of memory cells in accordance with one or more embodiments of the present disclosure. In one or more embodiments, a protective encapsulation material 322, e.g., a non-conformal protective encapsulation material, can be formed over programmable material 316 and/or an electrode material (not illustrated in FIG. 3A), e.g., electrode material 214 shown in FIGS. 2C and 2D. Encapsulation material 322 can be formed over electrode material 308, select device 307, electrode material 304, word line material 330, and/or substrate material 301 in some instances.

Encapsulation material 322 can act, for instance, as a hardmask over the stack. Encapsulation material 322 can be non-conformal such that encapsulation material 322 is deposited more on top surfaces, e.g., programmable material 316, than bottom and/or side surfaces, e.g., electrodes 304 and 308 and select device 307. Encapsulation material 322 can comprise, for example, silicon nitride, silicon carbide, and/or silicon oxide, among others.

Encapsulation material 322 can, for example, be formed after exhumation of the sacrificial material, e.g., sacrificial material 218 illustrated in FIGS. 2B and 2C. Encapsulation material 322 can protect the cell stack comprising programmable material 316 and an electrode material, e.g., electrode material 214, during the select device isolation etch. In one or more embodiments, encapsulation material 322 can be deposited using a physical vapor deposition (PVD) process, among others, for example.

FIG. 3B illustrates a portion of an array of memory cells shown in a stage subsequent to that shown in FIG. 3A. Encapsulation material 322 can be formed over the select device stack, including electrode material 304, select device 307, and electrode material 308. In one or more embodiments, encapsulation material 322 may be etched away faster on the stack comprising electrode materials 304 and 308 and select device 307, as compared to the stack comprising programmable material 316 and an electrode material.

In one or more embodiments, encapsulation material 322 can remain around programmable material 316 and the electrode material following the etching. In some instances, encapsulation material 322 can be completely removed from around programmable material 316 and the electrode material following etching. In one or more embodiments, encapsulation material 322 can be partially removed from around programmable material 316 and the electrode material following etching.

CONCLUSION

The present disclosure includes memory cell structures and method of forming the same. In one or more embodiments, forming a memory cell includes forming, in a first direction, a select device stack including a select device formed between a first electrode and a second electrode; forming, in a second direction, a plurality of sacrificial material lines over the select device stack to form a via; forming a programmable material stack within the via; and removing the plurality of sacrificial material lines and etching through a portion of the select device stack to isolate the select device.

In one or more embodiments, a memory cell includes a first stack structure comprising a first electrode, a select device over the first electrode, and a second electrode; and a second stack structure comprising a programmable material over the second electrode and a third electrode over the programmable material, wherein the second stack structure is a damascene structure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
 a plurality of stack structures in a length direction parallel to one another, and separated from each other in a first direction perpendicular to the length direction, wherein each of the plurality of stack structures comprises;
 plural select device stacks; and
 a dielectric material comprising plural segments;
 an electrode material formed in plural segments, each electrode segment extending in the length direction; and
 a non-conformal encapsulating material encapsulating the electrode material, such that there is encapsulating material on an entire top surface of the memory cell and on side surfaces of the memory cell,
  wherein the top surface comprises a programmable material, and the side surfaces comprise the first electrode, the second electrode, and the select device, and
  wherein more of the encapsulating material is on a top surface of the memory cell than on the side surfaces of the memory cell.

2. The memory cell of claim 1, wherein the non-conformal protective material encapsulates the programmable material formed in a trench extending in the length direction.

3. The memory cell of claim 1, wherein the plurality of stack structures and the electrode material are formed the same direction.

4. The memory cell of claim 2, wherein the programmable material and the electrode material are in a direction orthogonal to the direction of the plurality of stack structures.

5. The memory cell of claim 2, wherein the programmable material and the electrode material are in a direction at a sixty-degree angle to the direction of the plurality of stack structures.

6. The memory cell of claim 1, wherein the programmable material is at least one of resistive random-access memory (RRAM) material, conductive bridging random access memory (CBRAM) material, phase-change random access memory (PCRAM) material, and/or spin-transfer-torque random access memory (STT-RAM) material.

7. A memory cell, comprising:
a plurality of select device stack structures formed in a first direction, each of the plurality of select device stack structures comprising an isolated select device between a first electrode and a second electrode, wherein the isolated select device includes an etched portion to isolate the select device;
a plurality of trenches formed in a second direction of each of the plurality of select device stack structures;
a programmable material formed within each of the plurality of trenches over the second electrode of each of the plurality of select device stack structures;
a third electrode formed over the programmable material within each of the plurality of trenches; and
a non-conformal encapsulating material encapsulating the third electrode, such that there is non-conformal encapsulating material on an entire top surface of the memory cell and on side surfaces of the memory cell, wherein the top surface is the programmable material, and wherein the side surfaces comprise the first electrode, the second electrode, and the select device, and
wherein more of the encapsulating material is on the top surface of the memory cell than on the side surfaces of the memory cell.

8. The memory cell of claim 7, wherein the programmable material and the third electrode comprise a damascene structure.

9. The memory cell of claim 7, wherein each of the plurality of isolated select devices, the first electrode, and the second electrode is formed in the first direction, such that they are parallel to one another.

10. The memory cell of claim 9, wherein the programmable material and the third electrode are formed in the second direction substantially orthogonal to the first direction, such that the third electrode and the programmable material are formed orthogonal to the first electrode, each of the plurality of isolated select devices, and the second electrode.

11. The memory cell of claim 9, wherein the programmable material and the third electrode are formed in the second direction, which is at a sixty-degree angle to the first direction.

12. An array of memory cells, comprising:
a plurality of stack structures formed in a first direction, each one of the plurality of stack structures comprising:
plural select device stacks, wherein each of the plural select device stacks comprises a first electrode material separated from a second electrode material by a select device material;
a dielectric material between each of the plurality of stack structures;
a programmable material formed on the dielectric material of each of the plural select device stacks, wherein the programmable material includes a trench having a bottom and sidewalls;
a third electrode material filling the trench; and
a non-conformal encapsulating material encapsulating each memory cell of the array of memory cells, such that there is non-conformal encapsulating material on an entire top surface of each memory cell of the memory array of cells and on side surfaces of the each memory cell of the memory array of cells,
wherein the top surface is the programmable material, and the side surfaces comprise the first electrode material, the second electrode material, and the select device material, and
wherein more of the encapsulating material is on the top surface of each memory cell of the memory array of cells than on the side surfaces of a respective memory cell of the memory array of cells.

13. The array of claim 12, wherein the array of memory cells is configured in a cross-point memory cell array.

14. The array of claim 12, wherein the array of memory cells is configured in a three-dimensional cell array.

15. The array of claim 12, wherein the first direction is an access line direction, and wherein the second direction is a digit line direction.

16. The array of claim 12, wherein the select device material includes an etched portion to isolate the select device material.

* * * * *